United States Patent
Huang

(10) Patent No.: US 6,228,699 B1
(45) Date of Patent: May 8, 2001

(54) CROSS LEAKAGE OF CAPACITORS IN DRAM OR EMBEDDED DRAM

(75) Inventor: Jenn Ming Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/210,703

(22) Filed: Dec. 14, 1998

(51) Int. Cl.[7] .................................... H01L 21/8234
(52) U.S. Cl. ............................. 438/238; 438/253
(58) Field of Search ........................... 438/238, 253, 438/254; 257/751, 306, 307

(56) References Cited

U.S. PATENT DOCUMENTS

| | | | |
|---|---|---|---|
| 5,116,776 | * 5/1992 | Chan et al. | 437/52 |
| 5,219,781 | * 6/1993 | Yoneda | 437/52 |
| 5,362,666 | 11/1994 | Dennison | 437/47 |
| 5,364,813 | * 11/1994 | Koh | 437/52 |
| 5,405,796 | 4/1995 | Jones, Jr. | 437/47 |
| 5,413,950 | * 5/1995 | Chen et al. | 437/52 |
| 5,702,968 | * 12/1997 | Chen | 437/52 |
| 5,798,289 | 8/1998 | Ajika et al. | 438/239 |
| 5,847,460 | * 12/1998 | Liou et al. | 257/751 |

* cited by examiner

Primary Examiner—Richard Elms
Assistant Examiner—Bradley Smith
(74) Attorney, Agent, or Firm—George O. Saile; Stephen B. Ackerman

(57) ABSTRACT

A method of forming stacked capacitors for a DRAM structure. A thin layer of poly is deposited over the inside surface of the crown holes; the columns of the crown holes form the insulation between the DRAM capacitors. High temperature oxidation is performed on the exposed surface of this layer of poly creating thermal oxide. An anisotropic etch of the surface of the thermal oxide creates a thermal oxide film on the sidewalls of the inter-capacitance insulation. This thermal oxide film is positioned between the capacitors of the DRAM structure. It has superior film quality and as such reduces leakage current between DRAM capacitors. The bottom electrode for the capacitor is formed, ONO is grown on the exposed surface of the bottom electrode (forming the dielectric of the capacitor) after which the top electrode of the capacitor cell is formed.

23 Claims, 3 Drawing Sheets

CROSS LEAKAGE OF CAPACITORS IN DRAM OR EMBEDDED DRAM

BACKGROUND OF THE INVENTION

(1) Field of the Invention

The invention relates to the field of the manufacturing of semiconductor integrated circuits, and more specifically to the aspect of dielectric insulation between capacitors fabricated for DRAM cells.

(2) Description of Prior Art

The process technology in the manufacturing of Dynamic Random Access Memory (DRAM) has, during the last several decades, migrated from 0.8 um 4M memories to 0.25 um 256M memories with a continuing decrease in memory cell size and concurrent increase in memory capacity. This scaling down in memory cell capacity puts increased emphasis on the dielectric isolation between the DRAM cells since this dielectric isolation impacts data retention capability.

One of the process technologies that have been used in the manufacturing of DRAM devices is the process of Selective Epitaxial Growth (SEG) of silicon. This process allows the deposition of a silicon epitaxial layer on a bare silicon surface without the simultaneous growth of amorphous silicon thin film on the silicon dioxide or silicon nitride interface. The SEG process has been used to develop an epitaxy-over-trench (EOT) process for DRAM technology. This approach allows the transfer transistor to be fabricated directly over the storage capacitor, resulting in a high density DRAM.

DRAM memory is so named because its cells can retain information only for a limited period of time before they must be read and refreshed at periodic intervals. A DRAM cell consists of one transistor and one storage capacitor. For bit densities of up to one megabit, planar-type storage capacitors are used. However, as storage densities increase, the amount of charges needed for a sufficient noise margin remains fixed. Therefore, in order to increase the specific capacitance, two different routes have been taken. The first is to store charges vertically in a trench. The second solution, which allows the cell to shrink in size without losing storage capacity, is to stack the capacitor on top of the access transistor. It is apparent from this that, as the memory density increases, the capacitor structure becomes more intricate and growth in the vertical direction. The present invention addresses the solution of storing charges vertically in a trench.

DRAM storage cell capacity can be increased by making the capacitor dielectric thinner, by using a dielectric with a larger dielectric constant or by increasing the area of the capacitor. The first two options are not currently available since capacitor dielectrics thinner than those now being used in DRAM cells will suffer leakage due to an electron tunneling effect. Dielectrics with significantly larger dielectric constants than that of $SiO_2$ have not yet been accepted for DRAM application.

It must also be noted that since the 256-kbit DRAM generation bilayer films (consisting of both silicon nitride and $SiO_2$) have been used as the capacitor dielectric to increase cell capacitance. The higher dielectric constant of $Si_3Ni_4$ (twice as large as that of $SiO_2$) was responsible for this increase.

The approach of storing charges vertically in a trench results in stacking the storage capacitor on top of the access transistor. The lower electrode of the stacked capacitor (STC) is in contact with the drain of the access transistor whereby the bit line runs over the top of the stacked capacitor. For STC cells to be made feasible for larger capacity DRAM's, an insulator with a larger dielectric constant than that of $SiO_2$ must be used.

U.S. Pat. No. 5,362,666 (Dennision) and U.S. Pat. No. 5,405,796 (Jones, Jr.) show crown capacitor with conventional insulation between capacitors.

U.S. Pat. No. 5,798,289 (Ajika et al.) discloses several embodiments of capacitors.

SUMMARY OF THE INVENTION

It is the primary objective of the invention to reduce leakage currents between capacitors of a DRAM structure.

It is another objective of the invention to enhance DRAM data retention.

It is yet another objective of the present invention to teach a method that is easy to implement for reduction of leakage current between capacitors of a DRAM structure and for the enhancement of DRAM data retention.

The present invention teaches the formation of stacked capacitors for a DRAM structure. A layer of oxide (crown oxide) is deposited on top of the semiconductor substrate; openings (crown holes) are etched into this layer of oxide. A thin layer of poly is deposited over the inside surface of the crown holes and over the top surface of the insulation between the crown holes. High temperature oxidation is performed on the exposed surface of this layer of poly, this high temperature oxidation fully converts the poly to thermal oxide. An anisotropic etch of the surface of the thermal oxide creates only a thermal oxide film on the sidewalls of the inter-capacitance insulation. This thermal oxide film has superior film quality and increases the insulation between DRAM capacitors thereby reducing leakage current. The bottom electrode for the capacitor is formed, ONO is grown on the exposed surface of the bottom electrode (forming the dielectric of the capacitor) after which the top electrode of the capacitor cell is formed.

DESCRIPTION OF THE PREFERRED EMBODIMENTS

Figure 1:
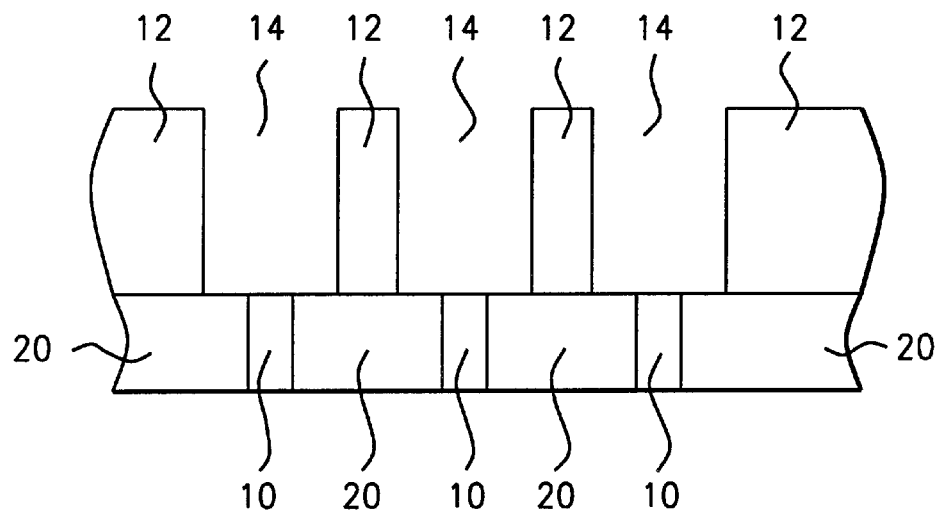
FIG. 1 shows the completion of the crown hole etch.

Referring now specifically to FIG. 1, there is shown a cross section of crown holes after etching is complete. Poly silicon layers 10 have been formed plug-like into layers 20 that consist of the dielectric $SiO_2$. Poly silicon layers 10 form the charge node contact points with the underlying transistor. A layer 12 of crown oxide consisting of $SiO_2$ is deposited, openings 14 are created within the crown oxide to form the cavities 14 into which the DRAM capacitors will be formed.

Figure 2:
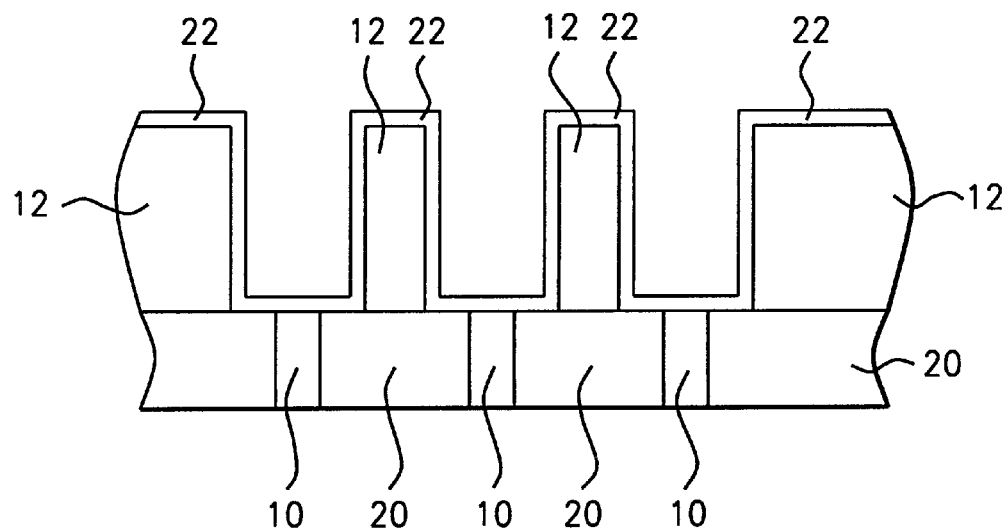
FIG. 2 shows the deposition of a thin layer of poly.

FIG. 2 shows a cross section of the structure after the deposition of a thin layer 22 of polysilicon. Layer 22 can be deposited using a conventional, low pressure furnace.

Figure 3:
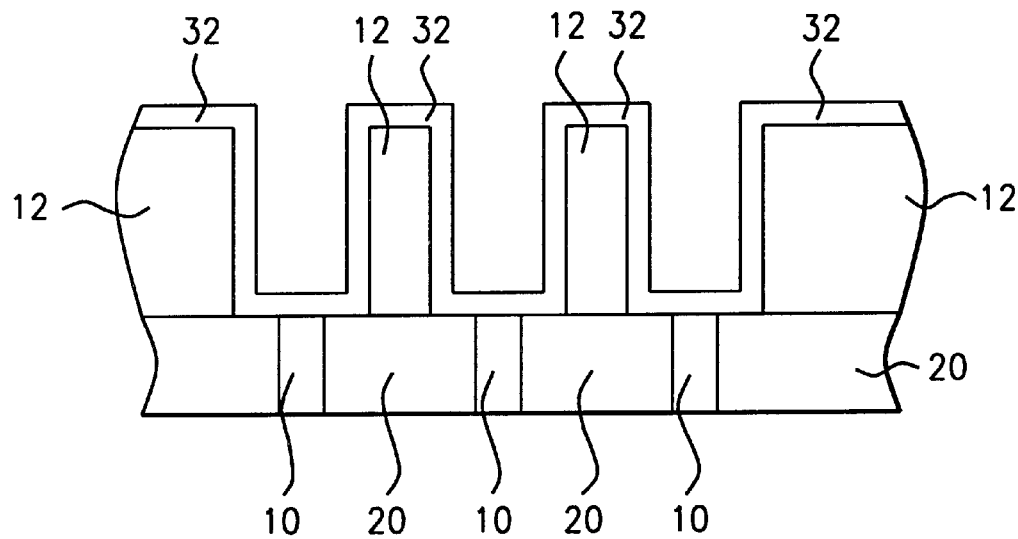
FIG. 3 shows the results of high temperature oxidation.

FIG. 3 shows a cross-section after a high temperature oxidation has been performed on the deposited layer of polysilicon. This high temperature oxidation fully converts the poly (22) to be a layer 32 of thermal oxide. The high temperature oxidation process can use conventional furnace oxidation, care must be taken that all of the poly (22) can be oxidized and is converted to $SiO_2$.

Figure 4:
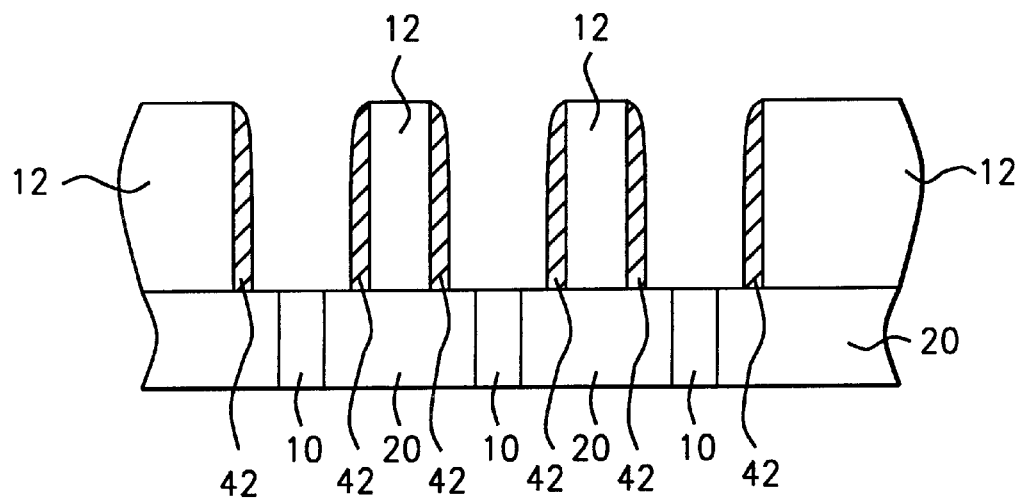
FIG. 4 shows an anti-isotropic oxide etching.

FIG. 4 shows a cross section after the completion of an anisotropic etch performed on the surface of the previously created layer of thermal oxide. Layers 42 of thermal oxide are now formed on the sides of the crown etch columns 12. These thermal oxide layers 42 have a better film quality than $SiO_2$ (such as PECVD or LP) and provide better insulation between the capacitors of the DRAM structure. This better film quality results in lower leakage current between DRAM capacitors. Layer 42 is deposited to a thickness within the range of between 500 and 2000 Angstrom.

Figure 5:
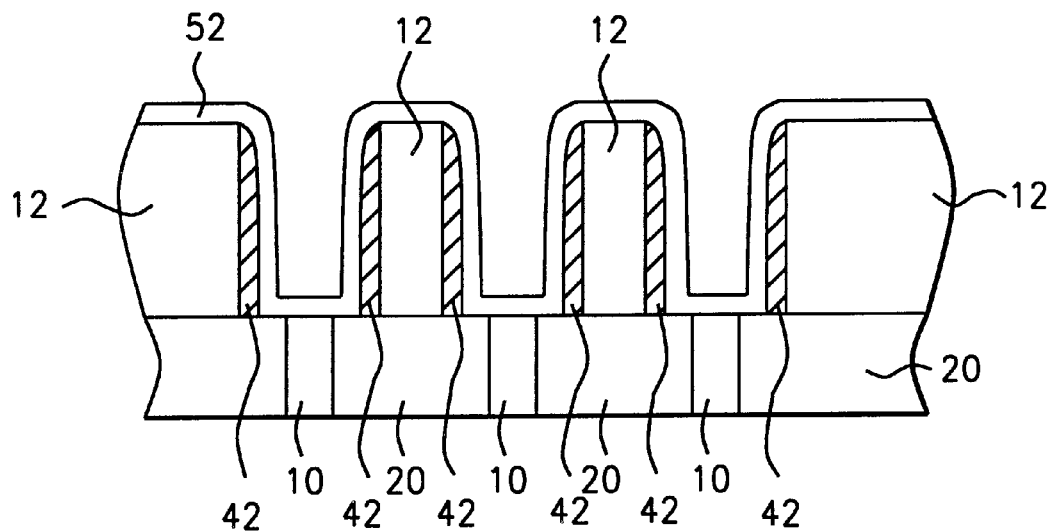
FIG. 5 shows the deposition of poly for the formation of the bottom electrode.

FIG. 5 shows a cross section after the completion of the deposition of a layer 52 of poly silicon. This layer 52 forms the bottom electrode of the capacitor that is being created. Layer 52 is deposited to a thickness within the range of between 500 and 1000 Angstrom.

Figure 6:
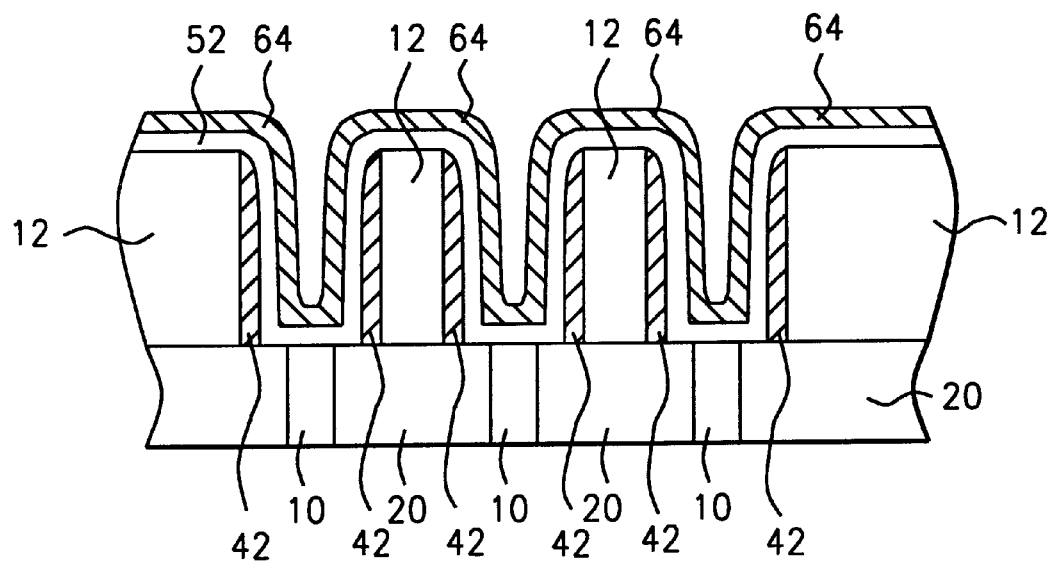
FIG. 6 shows poly CMP followed by ONO growth followed by poly deposition and definition for cell growth.

FIG. 6 shows a cross section after the completion of the steps of CMP of the deposited poly silicon 52 (FIG. 5) creating the bottom electrodes 52 of the capacitor. Also shown in FIG. 6 is the growth of a layer of ONO (not highlighted and forming a layer on the surface of the bottom electrodes 52 that is oriented toward the capacitor that is being created thus forming the dielectric of the capacitor). The deposition of a layer 64 of poly completes the definition of the capacitor cell top electrode 64. In the layer of oxide-nitride-oxide, the first layer of oxide is native oxide. The nitride is grown in a low pressure furnace at a temperature within the range of 600 to 700 degrees C. to a thickness within the range of between 40 and 60 Angstrom, the final oxidation layer is grown in a low pressure furnace at a temperature within the range between 750 and 850 degrees C. for a time period within the range between 30 and 60 minutes. The layer of ONO obtained in this manner has a leakage current that is smaller than $10^{-8}$ amperes/cm$^2$. The layer 64 of poly is deposited to a thickness within the range of between 500 and 1000 Angstrom.

Although the present invention is illustrated and described herein as embodied in the construction of a stacked DRAM capacitor, it is nevertheless not intended to be limited to the details as presented. Rather, various modifications may be made in the details within the scope and range of equivalents of the claims and without departing from the spirit of the invention.

What is claimed is:

1. A method of manufacturing a semiconductor memory device having stacked capacitors which are formed on capacitor forming regions, separated from each other on a main surface of a semiconductor substrate, comprising the steps of:

forming charge node contact regions within the surface of said semiconductor substrate;

depositing an insulation layer over said surface of said semiconductor substrate;

patterning and etching said insulation layer;

depositing a first layer of polysilicon;

performing high temperature oxidation to fully oxidize said first layer of polysilicon;

etching of said fully oxidized polysilicon;

depositing a second layer of polysilicon;

planarizing said second layer of polysilicon;

performing ONO growth on said second layer of polysilicon; and depositing a third layer of polysilicon.

2. The method of claim 1 wherein said insulating layer contains silicon dioxide.

3. The method of claim 1 wherein said patterning and etching said insulation layer is patterning an array of stacked capacitors followed by etching said array down to the top surface of said charge node contacts thereby partially exposing the top surface of said semiconductor substrate creating openings for said stacked capacitors.

4. The method of claim 1 wherein said depositing a first layer of polysilicon is depositing a thin layer of polysilicon over the inside surface of said openings for said stacked capacitors while also covering the top surface of said patterned and etched insulating layer.

5. The method of claim 1 wherein said high temperature oxidation of said first layer of polysilicon is a Rapid Thermal Oxidation (RTO) process.

6. The method of claim 1 wherein said high temperature oxidation of said first layer of polysilicon is a furnace oxidation whereby all of said first layer of polysilicon is oxidized to form $SiO_2$.

7. The method of claim 1 wherein said etching of said fully oxidized first layer of polysilicon is an anisotropic etch whereby said fully oxidized layer of first poly forms a layer of thermal oxide along the sidewalls of said openings for said stacked capacitors thereby negating the need to remove the first poly by etching.

8. The method of claim 1 wherein said depositing a second layer of polysilicon is depositing polysilicon over the exposed sides of said thermal oxide while further depositing polysilicon over the exposed surface of said semiconductor substrate and the top surface of said patterned and etched insulating layer.

9. The method of claim 1 wherein said planarizing said second layer of silicon is removing said second layer of polysilicon from the top surface of said insulating layer thereby creating the bottom electrode of said stacked capacitors whereby said planarizing is a CMP process.

10. The method of claim 1 whereby said ONO growth is growing a layer of oxide-nitride-oxide on the exposed surfaces of said deposited second layer of polysilicon and said top surface of said insulating layer.

11. The method of claim 1 whereby said ONO growth is performed by Low Pressure CVD (LPCVD).

12. The method of claim 1 wherein said depositing a third layer of polysilicon is depositing a layer of polysilicon over said layer of ONO thereby forming the top plate for said stacked capacitor.

13. A method of manufacturing a semiconductor memory device having stacked capacitors which are formed on capacitor forming regions, separated from each other on a main surface of a semiconductor substrate, comprising the steps of:

forming a first insulating layer having an opening reaching the main surface of said semiconductor substrate by depositing a insulation layer over said surface of said semiconductor substrate and patterning and etching said insulation layer;

forming a second insulating layer on the sidewalls of said first insulating layer by depositing a first layer of polysilicon, performing oxidation of said first layer of polysilicon, and etching of said fully oxidized first layer of polysilicon;

forming a first conductive layer on the surface of said second insulating layer by depositing a second layer of polysilicon and planarizing said second layer of polysilicon, whereby said depositing a second layer of polysilicon is depositing a layer of polysilicon over the inside surfaces of said insulating film further over the exposed surface of said semiconductor substrate further over the top surface of said insulating columns, whereby said planarizing said second layer of polysilicon is removing said second insulating layer from said top surface of said insulating columns thereby forming a bottom plate of said stacked capacitors;

forming a third insulating layer on the surface of said first conductive layer and the top surface of said first insulating layer by creating of a layer of oxide-nitride-oxide on said bottom plate of said stacked capacitors; and forming a second conductive layer on top of said third insulating layer, by depositing a third layer of polysilicon, forming a top plate of said stacked capacitor.

14. The method of claim 13 wherein said first insulating layer comprises silicon dioxide deposited using CVD technology.

15. The method of claim 13 wherein said first insulating layer comprises undoped silicon dioxide.

16. The method of claim 13 wherein said etching said first insulating layer uses a solution containing fluoride thereby creating holes for said stacked capacitors.

17. The method of claim 13 wherein said etching of said first insulating layer uses a $CHF_3$ plasma thereby creating the holes for said stacked capacitors.

18. The method of claim 13 wherein said first insulating layer comprises phosphorous doped silicon dioxide.

19. A method of manufacturing a semiconductor memory device having stacked capacitors which are formed on capacitor forming regions, separated from each other on a main surface of a semiconductor substrate, comprising the steps of:

forming a first insulating layer having an opening reaching the main surface of said semiconductor substrate by depositing a insulation layer over said surface of said semiconductor substrate and patterning and etching said insulation layer;

forming a second insulating layer on the sidewalls of said first insulating layer by depositing a first layer of polysilicon, performing oxidation of said first layer of polysilicon, and etching of said fully oxidized first layer of polysilicon, wherein said forming a second insulating layer on the sidewalls of said first insulating layer is depositing a first layer of polysilicon, oxidation of said first layer of polysilicon and etching of said fully oxidized first layer of polysilicon;

forming a first conductive layer on the surface of said second insulating layer by depositing a second layer of polysilicon and planarizing said second layer of polysilicon, whereby said depositing a second layer of polysilicon is depositing a layer of polysilicon over the inside surfaces of said insulating film further over the exposed surface of said semiconductor substrate further over the top surface of said insulating columns, whereby said planarizing said second layer of polysilicon is removing said second insulating layer from said top surface of said insulating columns thereby forming a bottom plate of said stacked capacitors;

forming a third insulating layer on the surface of said first conductive layer and the top surface of said first insulating layer by creating of a layer of oxide-nitride-oxide on said bottom plate of said stacked capacitors; and forming a second conductive layer on top of said third insulating layer, by depositing a third layer of polysilicon, forming a top plate of said stacked capacitor.

20. The method of claim 19 wherein said depositing a first layer of polysilicon is depositing a thin layer of silicon within said openings for said stacked capacitors and on the top surface of said first insulation columns.

21. The method of claim 19 wherein said performing oxidation of said first layer of polysilicon is a high temperature oxidation of said first layer of polysilicon.

22. The method of claim 19 wherein said oxidation of said first layer of polysilicon is a Rapid Thermal Oxidation (RTO) process.

23. The method of claim 19 wherein said performing etching of said fully oxidized first layer of polysilicon is an anisotropic etching process thereby forming a insulating film of high quality oxide on the sidewalls of said holes for said stacked capacitor.

* * * * *